United States Patent
Chuang

(10) Patent No.: US 7,084,530 B2
(45) Date of Patent: Aug. 1, 2006

(54) SIMULTANEOUS SWITCHING OUTPUT BOUNCE REDUCTION DEVICE AND METHOD

(75) Inventor: Ying-Lang Chuang, Taipei (TW)

(73) Assignee: Via Technologies, Inc., Taipei (TW)

( * ) Notice: Subject to any disclaimer, the term of this patent is extended or adjusted under 35 U.S.C. 154(b) by 392 days.

(21) Appl. No.: 10/603,837

(22) Filed: Jun. 25, 2003

(65) Prior Publication Data

US 2004/0001300 A1    Jan. 1, 2004

(30) Foreign Application Priority Data

Jun. 28, 2002    (TW) ................ 91114392 A

(51) Int. Cl.
*H01H 1/50* (2006.01)
(52) U.S. Cl. .................................... 307/137
(58) Field of Classification Search .............. 307/137
See application file for complete search history.

(56) References Cited

U.S. PATENT DOCUMENTS

| | | | | |
|---|---|---|---|---|
| 5,920,204 A * | 7/1999 | Bruno | .................. | 326/86 |
| 6,043,682 A * | 3/2000 | Dabral et al. | .................. | 326/86 |
| 6,229,336 B1 * | 5/2001 | Felton et al. | .................. | 326/38 |
| 6,294,925 B1 * | 9/2001 | Chan et al. | .................. | 326/37 |
| 6,345,380 B1 * | 2/2002 | Bonaccio et al. | .............. | 716/12 |
| 6,622,256 B1 * | 9/2003 | Dabral et al. | .............. | 713/600 |
| 2003/0042925 A1 * | 3/2003 | Kirk | .......................... | 324/765 |
| 2003/0159096 A1 * | 8/2003 | Balzer | ........................ | 714/726 |

* cited by examiner

*Primary Examiner*—Lynn Feild
*Assistant Examiner*—Michael Rutland-Wallis
(74) *Attorney, Agent, or Firm*—Madson & Austin

(57) ABSTRACT

A signal bounce inhibiting device and a signal bounce inhibiting method are provided for preventing power/ground bounce resulting from simultaneous switching output. The signal bounce inhibiting device includes an electric level toggling circuit and an electric level recovering circuit. The electric level toggling circuit receiving an internal signal of the first chip, and toggling the internal signal into a first output signal in response to a first toggling control signal. The electric level recovering circuit receiving the first output signal, and recovering the first output signal into the internal signal required by a second chip in response to a first recovering control signal.

14 Claims, 4 Drawing Sheets

SIMULTANEOUS SWITCHING OUTPUT BOUNCE REDUCTION DEVICE AND METHOD

FIELD OF THE INVENTION

The present invention relates to a signal bounce inhibiting device and a signal bounce inhibiting method, and more particularly to a signal bounce inhibiting device and a signal bounce inhibiting method for reducing simultaneous switching output bounce.

BACKGROUND OF THE INVENTION

Although more and more functions are incorporated into a chip, the pin number of a chip tends to be reduced in order to minimize the chip size. Practically, power and ground pins of the chip are the targets to be reduced. Alternatively, the chip size can also be reduced by decreasing the pad width of the power and ground pins or the clearance between pins of the chip.

In above cases, however, the phenomenon of power bounce or ground bounce is likely to occur. Since the number or the pad width of the power pins is reduced, the power supply is limited. When a lot of output signals of the output devices in the chip are simultaneously switched to high electric levels, there would be no sufficient power supply for the level switching operations. Therefore, a jumping and unstable phenomenon in the output signal occurs, which is so-called as "power bounce". Therefore, the electric level of the output signal from the output device will continuously toggle, resulting in possible errors of another chip electrically connected to the output end of the present chip.

Likewise, when the number or the pad width of the ground pins is not great enough or the distance between pins is too small, "ground bouce" may also occur. It is because the toggling action of an output signal will affect the electric level of an adjacent output signal via the ground pin so as to result in a continuous toggle phenomenon. The continuous toggle phenomenon is even significant when a plurality of adjacent output devices are simultaneously switched to the ground state. Under this circumstance, the ground pin itself will be jumping and unstable so as to result in ground bounce. The power/ground bounce, if occurs, adversely affects the output stability of the chip.

Please refer to FIG. 1 which is a diagram showing the waveform associated with exemplified output devices of a chip. The signal bounces of the output signals from the output devices and the ground signal at the grounding line are shown. As shown in the upper part of FIG. 1, a chip C includes output devices CQ1 and CQ2 with CMOS structures. The output device CQ1 includes transistors Q11 and Q12, and is electrically connected to an output pad (pad1) by an output end thereof. The output device CQ2 includes transistors Q21 and Q22, and is electrically connected to an output pad (pad2). Further, a grounding line VSSO provides the grounding path of the output devices CQ1 and CQ2.

When a high electric level signal is inputted to the input end C12 of the output device CQ2, an output signal outputted from the output pad "pad2" of the output device CQ2 is a stably low electric level signal, which is at a ground state. Once a high electric level signal is also inputted to the input end CI1 of the adjacent output device CQ1, signal bounce may appear at the output pad "pad1" before the electric level becomes stably low, i.e. at a ground state, as shown in curve A of FIG. 1. The situation is likely to occur when the pin number or pad width of the chip C is insufficient or the clearance between the output devices CQ1 and CQ2 is too small. Due to the signal bounce, the electric level of the output signal at the output pad "pad2" is influenced by the coupling effect of the grounding line VSSO. The electric level of the output signal is thus bouncing. Moreover, the electric level of the ground signal at the ground line VSSO is also disturbed.

For solving the above power-bounce or ground-bounce problems, lots of attempts have been made, which include enhancing the driving capability of the chip by increasing the number or pad width of power pins, introducing interleaving driving operations by adding delay gate(s) so as to avoid simultaneously active high or active low status, increasing the slew rate of the electric level toggle, or enlarging the clearance between the output devices. Unfortunately, the chip size is inevitably increased or the chip design is hardly feasible due to high operation frequency accordingly.

A terminator structure conventionally used for solving the signal reflection problem resulting from rapid signal transmission may have a little effect on solving the signal bounce problem. Please refer to FIG. 2 which is a schematic diagram illustrating the terminator structure. In this structure, pins, e.g. pins P1, P5 and Pn among the output pins P1~Pn of the chip C, are connected to a resistor R1 and a diode D1, a resistor R5 and a diode D5, and a resistor Rn and a diode Dn, respectively. The resistors R1, R5 and Rn are connected to a power source +Vcc. This structure, although solving some signal bounce problem, cannot solve the power/ground bounce problem. It is because this terminator structure can work well to inhibit signal bounce only under stable power/ground signals.

Therefore, the purpose of the present invention is to develop a signal bounce inhibiting device to deal with the above situations encountered in the prior art.

SUMMARY OF THE INVENTION

An object of the present invention is to provide a signal bounce inhibiting device capable of flexibly distributing the electric levels of the output signals from the output pins of the chip.

Another object of the present invention is to provide a chip architecture having minimized power/ground bounce by flexibly distributing the electric levels of the output signals from a chip.

A further object of the present invention is to provide a method for providing optionally toggled internal signals from a first chip to a second chip to inhibit power/ground bounce.

A first aspect of the present invention relates to a signal bounce inhibiting device for preventing from power/ground bounce. The signal bounce inhibiting device comprises an electric level toggling circuit receiving a first internal signal of a first chip, and toggling the first internal signal into a first output signal in response to a first toggling control signal inputted therein; and an electric level recovering circuit receiving the first output signal, and recovering the first output signal into the first internal signal required by a second chip in response to a first recovering control signal inputted therein.

Preferably, the electric level toggling circuit is disposed in an output stage of the first chip and the electric level recovering circuit is disposed in an input stage of the second chip.

Preferably, the electric level toggling circuit further receives a second internal signal and remains the second internal signal unchanged as a second output signal in response to a second toggling control signal inputted therein, and the electric level recovering circuit remains the second output signal unchanged in response to a second recovering control signal inputted therein so as to provide the second internal signal for the second chip.

Preferably, the electric level toggling circuit includes a first count of electric level toggling units for toggling a second count of the first internal signals into the first output signals in response to the second count of first toggling control signals, and remaining a third count of the second internal signals into the second output signals in response to the third count of second toggling control signals. The electric level recovering circuit includes the first count of electric level recovering units for recovering the second count of the first output signals into the first internal signals in response to the second count of the first recovering control signals, and remaining the third count of the second output signals into the second internal signals in response to the third count of the second recovering control signals.

In an embodiment, the electric level toggling circuit includes a plurality of electric level toggling units. Each of the electric level toggling units includes a register for inputting therein and storing a certain toggling control signal; and an XOR gate for receiving the certain toggling control signal and a certain internal signal to perform a first XOR operation, thereby toggling the certain internal signal or remaining the certain internal signal unchanged so as to obtain a certain output signal. The electric level recovering circuit includes a plurality of electric level recovering units. Each of the electric level recovering units includes a register for inputting therein and storing a certain recovering control signal corresponding to the certain toggling control signal; and an XOR gate for receiving the certain recovering control signal and the certain output signal to perform a second XOR operation, thereby toggling or remaining the certain output signal so as to recover the certain output signal into the certain internal signal.

Preferably, the first and the second toggling control signals are identical to the first and the second recovering control signals.

A second aspect of the present invention relates to a signal bounce inhibiting device embedded in an integrated chip for preventing signals from power/ground bounce. The signal bounce inhibiting device comprises an electric level toggling circuit toggling a first internal signal into a first output signal in response to a first toggling control signal and remaining a second internal signal unchanged as a second output signal in response to a second toggling control signal; and a storing device for storing the first toggling control signal and the second toggling control signal.

Preferably, the electric level toggling circuit includes a first count of electric level toggling units for toggling a second count of the first internal signals into the first output signals in response to the second count of first toggling control signals, and remaining a third count of the second internal signals into the second output signals in response to the third count of second toggling control signals.

Preferably, the electric level toggling circuit includes a plurality of electric level toggling units, each of which includes an XOR gate for receiving the first toggling control signal and the first internal signal to perform a first XOR operation, thereby toggling the first internal signal, or for receiving the second toggling control signal and the second internal signal to perform a second XOR operation, thereby remaining the second internal signal unchanged.

Preferably, the storing device includes a plurality of storing units, each of which includes a register for inputting thereinto and storing the first toggling control signal or the second toggling control signal.

Preferably, the signal bounce inhibiting device further comprises an electric level recovering circuit disposed in a target chip for receiving and recovering the first output signal into the first internal signal in response to a first recovering control signal inputted therein.

Preferably, the electric level recovering circuit remains the second output signal unchanged in response to a second recovering control signal so as to provide the second internal signal for the target chip.

Preferably, the electric level recovering circuit includes a first count of electric level recovering units for recovering a second count of the first output signals into the first internal signals in response to the second count of the first recovering control signals, and remaining the third count of the second output signals into the second internal signals in response to the third count of the second recovering control signals.

Preferably, the electric level toggling circuit includes a plurality of storing units, each of which includes a register for inputting therein and storing the first recovering control signal or the second recovering control signal.

A third aspect of the present invention relates to a method for providing internal signals from a first chip to a second chip with inhibited power/ground bounce. The method comprises steps of asserting a plurality of toggling control signals including a first count of first toggling control signals and a second count of second toggling control signals; toggling the first count of the internal signals into the first count of output signals in response to the first count of the first toggling control signals, and remaining the second count of the internal signals unchanged in response to the second count of the second toggling control signals; asserting a plurality of recovering control signals correlating to the plurality of toggling control signals, and including the first count of first recovering control signals and the second count of second recovering control signals; and recovering the first count of the output signals into the first count of the internal signals in response to the first count of the first recovering control signals, and remaining the second count of the internal signals unchanged in response to the second count of the second recovering control signals.

Preferably, the first and the second toggling control signals are identical to the first and the second recovering control signals. For example, the first toggling control signal and the first recovering control signal are both at high levels, and the second toggling control signal and the second recovering control signal are both at low levels.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
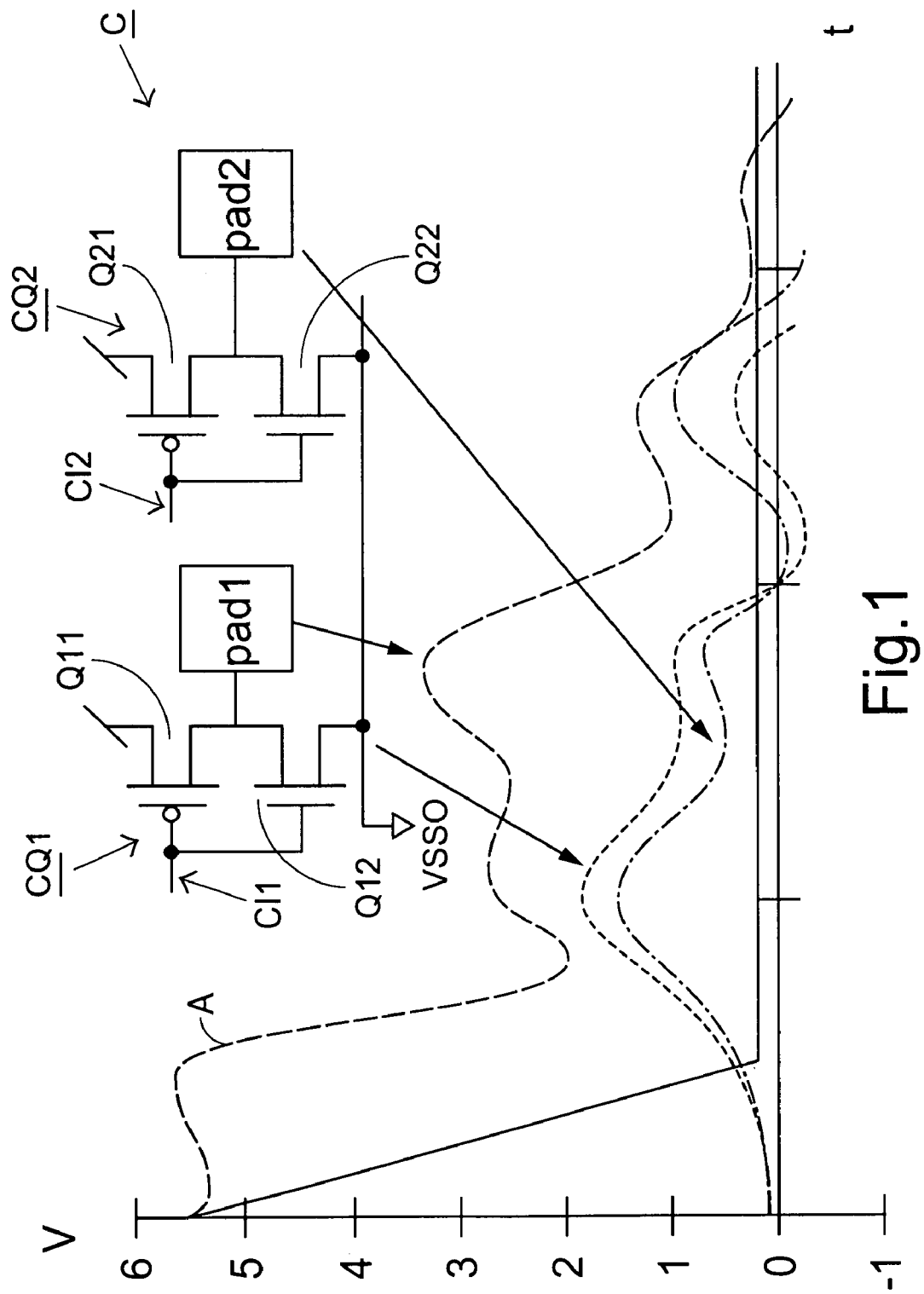
FIG. 1 is a diagram showing the waveform associated with exemplified output devices of a chip.
Figure 2:
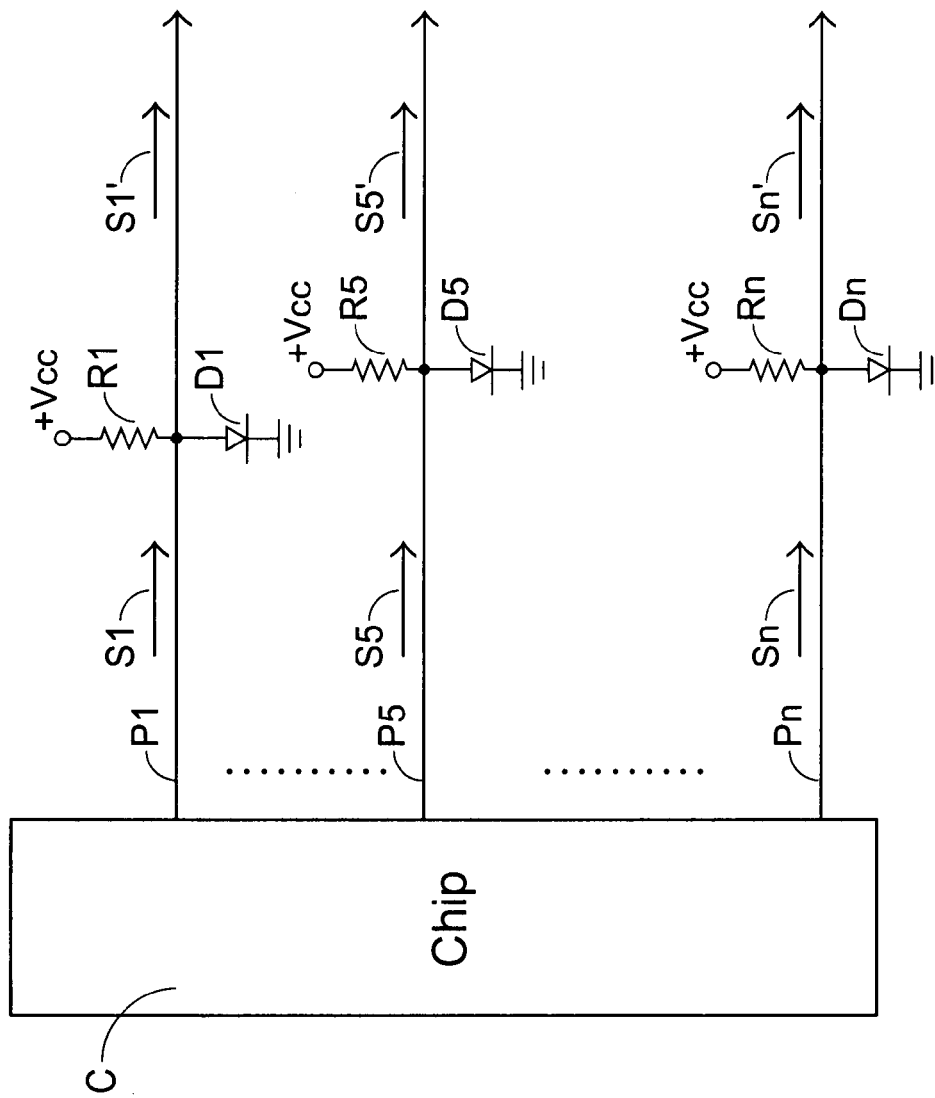
FIG. 2 is a schematic diagram illustrating a conventional signal bounce inhibiting means.
Figure 3A:
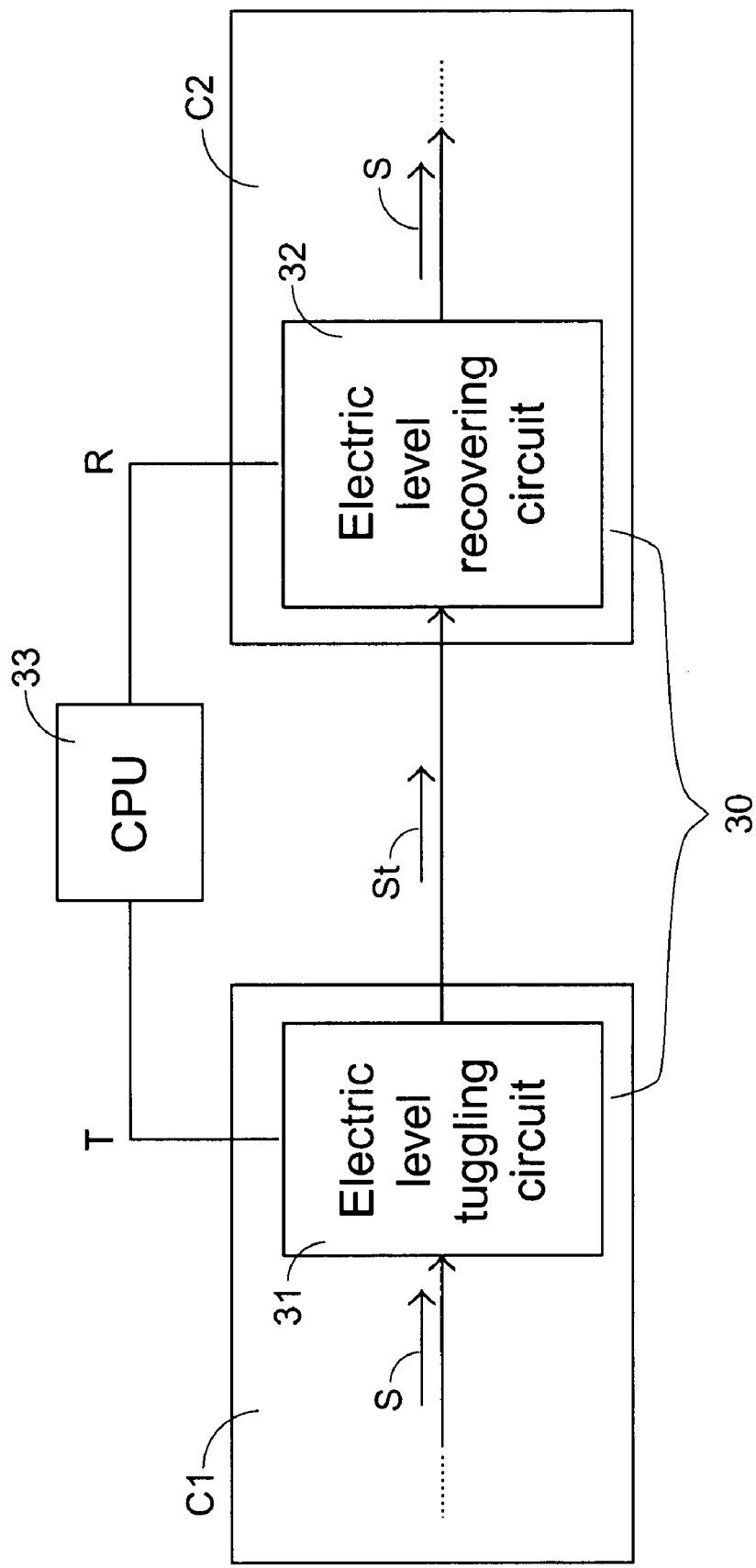
FIG. 3A is a schematic diagram illustrating a chip architecture comprising a signal bounce inhibiting device according to the present invention.

Please refer to FIG. 3A which shows a chip architecture according to the present invention. A first chip C1 is coupled to a second chip C2 and provides a plurality of internal signals S for the second chip C2. A signal bounce inhibiting device comprising an electric level toggling circuit 31 arranged in the output stage of the first chip C1 and an electric level recovering circuit 32 arranged in the input stage of the second chip C2. The states of the internal signals are monitored. When more than a predetermined threshold number of the internal signals are simultaneously switched to high electric levels or low levels, signal bounce may be generated. Thus the function of the signal bounce inhibiting device is activated to toggle a selected portion of the internal signals so as to reduce the number of the internal signal switching simultaneously.

In order to toggle the internal signals S, a set of toggling control signals T are asserted and inputted to the electric level toggling circuit 31. The set of toggling control signals T includes first toggling control signals controlling selected ones of the internal signals S to toggle, and second toggling control signals controlling the other ones of the internal signals not to toggle. In response to the toggling control signals T, the internal signals S are transmitted to and processed by the electric level toggling circuit 31 to obtain different output signals St, i.e. some of the output signals St are toggled and the others remain unchanged. The output signals St then enter the electric level recovering circuit 32 in the second chip C2 to be further processed. In the second chip C2, a set of recovering control signals R are asserted and inputted to the electric level recovering circuit 32. The set of recovering control signals R correlate to and vary with the set of toggling control signals T. Accordingly, corresponding to the first and second toggling control signals, first and second recovering control signals are included in the set of recovering control signals R, and what parts of the output signals St should be recovered by the electric level recovering circuit 32 can be determined in response to the first recovering control signals. Preferably, the set of recovering control signals R and the set of toggling control signals T are identical and asserted by the same CPU 33. In other words, upon the internal signals S are transmitted from the first chip C1 to the second chip C2, the toggling and recovering control signals T and R are provided for the first and the second chips C1 and C2, respectively. In response to the first recovering control signals, the toggled ones of the output signals St are recovered into the internal signals S, while in response to the second recovering control signals, the unchanged ones of the output signals St still remain unchanged. The details relating to how the electric level toggling circuit 31 and the electric level recovering circuit 32 work will be described hereinafter.

Figure 3B:
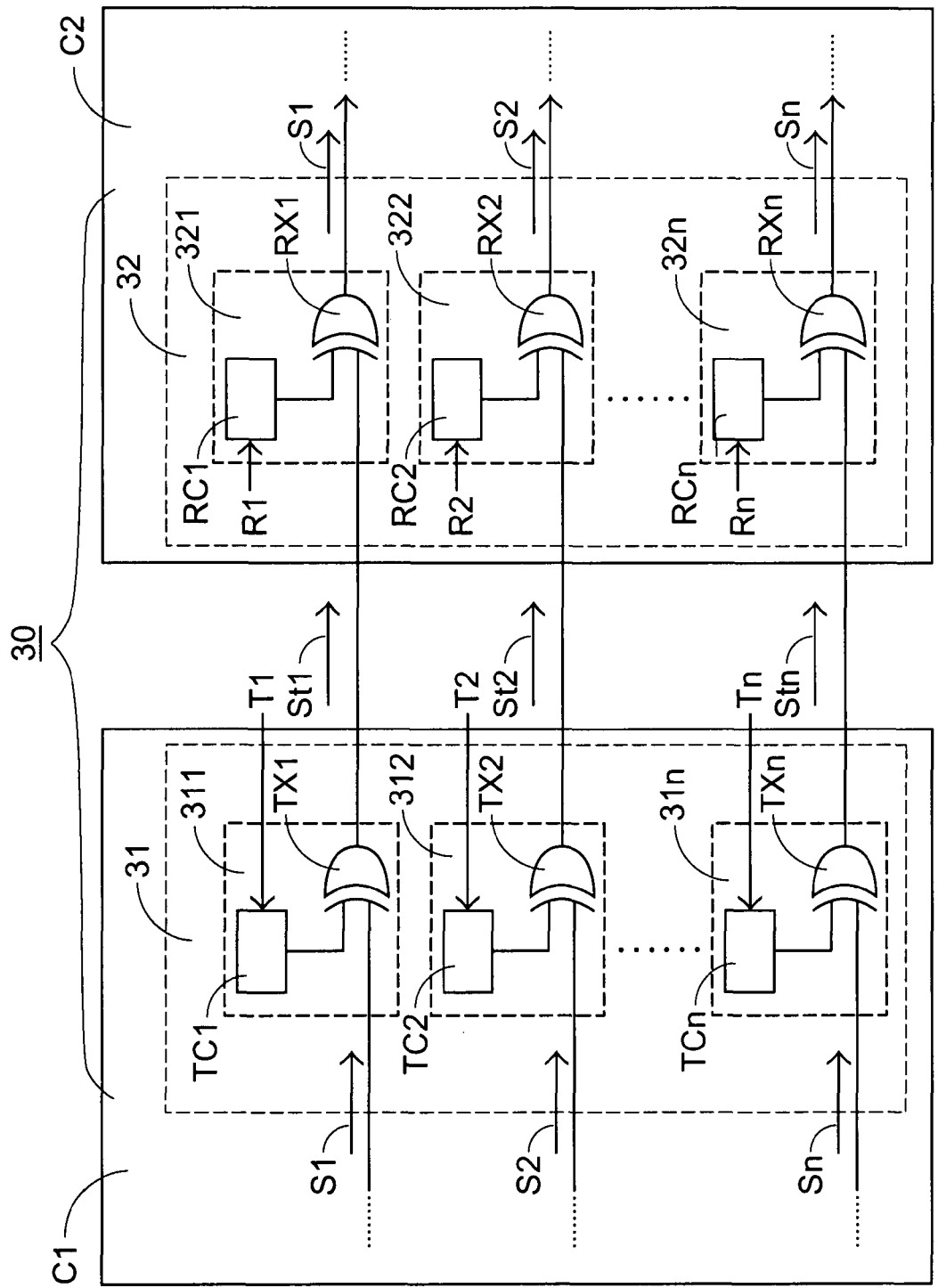
FIG. 3B is a schematic diagram illustrating an embodiment of the signal bounce inhibiting device of FIG. 3A.

Please refer to FIG. 3B, in which a preferred embodiment of the signal bounce inhibiting device according to the present invention is illustrated. The electric level toggling circuit 31 includes N electric level toggling units 311, 312, . . . , 31n, and the electric level recovering circuit 32 includes N electric level toggling units 321, 322, . . . , 32n. Each pair of the electric level toggling and recovering units process one of the N internal signals S1~Sn. In this embodiment, the count of the electric level toggling units 311~31n or electric level recovering units 321~32n is equal to the total count of the internal signals S1~Sn to be provided from the first chip C1 to the second chip C2.

Preferably, the set of recovering control signals R and the set of toggling control signals T are generated by a series of test procedures. By providing various tested control signals, the simultaneous switching output (SSO) degrees in the chip system are observed. The test results are recorded in the system, e.g. in an optical recording and reproducing system. Then, according to practical applications, suitable toggling and recovering control signals are provided for the first and the second chips, respectively, to perform the signal bounce inhibiting operations as mentioned above. On the basis of the test results, the pins never to be toggled in response to the toggling control signals are known. For these pins, no electric level toggling units are required. Therefore, the electric level recovering units as well as the electric level toggling units can be omitted for cost and chip-size reduction. The elements showing in FIG. 3B are applied hereto to illustrate this embodiment that some of the pins are omitted from coupling thereto electric level toggling and recovering units.

In this embodiment, more than N internal signals S, for example M internal signals, are to be provided from the first chip C1 to the second chip C2, for example M internal signals, are internal signals S1~Sn, are processed by the signal bounce inhibiting device of the present invention. Accordingly, only the internal signals S1~Sn are transmitted through the electric level toggling units 311, 312, . . . , 31n and electric level recovering units 321, 322, . . . , 32n to be processed according to the present invention. It is to be noted that the internal signals S1~Sn in this alternative embodiment do not have to be immediately adjacent to one another. The numbers 1~n just indicate N ones among the M internal signals are processed rather than imply the continuity of the N internal signals. The electric level toggling and recovering units are arranged according to the test results stored in the system drive.

In both of the above embodiments, it is preferred that the electric level toggling units 311, 312, . . . , 31n include respective registers TC1, TC2, . . . , TCn, and XOR gates TX1, TX2, . . . , TXn. Likewise, the electric level toggling units 311, 312, . . . , 31n include respective registers RC1, RC2, . . . , RCn, and XOR gates RX1, RX2, . . . , RXn. When it is determined too many internal signals are switching their states at the same time, the toggling control signals T1, T2, . . . , Tn are inputted and stored into the registers TC1, TC2, . . . , TCn, respectively. Some of the toggling control signals T1, T2, . . . , Tn, which are at high levels, which are, and the others are made at low levels to serve as the second toggling control signals. The XOR gates TX1, TX2, . . . , TXn receive corresponding internal signals S1, S2, . . . , Sn and toggling control signals T1, T2, . . . , Tn from the registers TC1, TC2, . . . , TCn, respectively, and perform XOR operations on those signals to obtain output signals St1, St2, . . . , Stn. Therefore, for those XOR gates that receive the first toggling control signals at high levels, the internal signals are toggled to obtain output signals with changed electric levels. On the other hand, for those XOR gates that receive the second toggling control signals at low levels, the internal signals are not toggled so as to obtain output signals without electric level change. By this way, the number of internal signals that are simultaneously changing their states can be reduced so as to inhibit the signal bounce, e.g. power/ground bounce.

After the internal signals S1, S2, ..., Sn are processed into the output signals St1, St2, ..., Stn by the electric level toggling circuit 31 in the first chip C1, and provided for the second chip C2, the output signals St1, St2, ..., Stn should be recovered to the original internal signals S1, S2, ..., Sn by the electric level recovering circuit 32. The recovering control signals R1, R2, ..., Rn including the first and the second recovering control signals are inputted and stored into the registers RC1, RC2, ..., RCn, respectively. Some of the recovering control signals R1, R2, ..., Rn are at high levels and serve as the first recovering signals, and the others are made at low levels and serve as the second recovering control signals. The XOR gates RX1, RX2, ..., RXn receive corresponding output signals St1, St2, ..., Stn and recovering control signals R1, R2, ..., Rn from the registers RC1, RC2, ..., RCn, respectively, and perform XOR operations on those signals to obtain recovered signals S1, S2, ..., Sn. Therefore, for those XOR gates that receive the recovering control signals at high levels, the output signals change their electric levels to be recovered to the internal signals. On the other hand, for those XOR gates that receive the recovering control signals at low levels, the electric levels of the output signals, which have not been toggled previously, are not changed so that the corresponding original internal signals corresponding original.

According to the present invention, the signal bounce can be inhibited by properly toggling some of the signals on simultaneously changing. Further, since the toggling operations can be performed on selected internal signals, it is very flexible for various chip architectures.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal bounce inhibiting device for preventing power/ground bounce resulting from signal transmission from a first chip to a second chip, comprising:
    an electric level toggling circuit receiving a first internal signal from said first chip, and toggling said first internal signal with a first electric level into a first output signal with a second electric level in response to a first toggling control signal; and
    an electric level recovering circuit receiving said first output signal with said second electric level, recovering said first output signal with said second electric level into said first internal signal with said first electric level in response to a first recovering control signal, and providing said first internal signal with said first electric level for said second chip.

2. The signal bounce inhibiting device according to claim 1 wherein said electric level toggling circuit is disposed in an output stage of said first chip and said electric level recovering circuit is disposed in an input stage of said second chip.

3. The signal bounce inhibiting device according to claim 1 wherein said electric level toggling circuit further receives a second internal signal from said first chip, which remains unchanged in response to a second toggling control signal and is outputted as a second output signal identical to said second internal signal, and said electric level recovering circuit receives said second output signal from said electric level toggling circuit, which remains identical to said second internal signal and is provided for said second chip.

4. The signal bounce inhibiting device according to claim 3 wherein said electric level toggling circuit includes a plurality of electric level toggling units for toggling or untoggling a plurality of internal signals in response to respective toggling control signals.

5. The signal bounce inhibiting device according to claim 4 wherein said electric level recovering circuit includes a plurality of electric level recovering units for recovering said plurality of internal signals by changing said toggled internal signals and holding said untoggled internal signals in response to respective recovering control signals.

6. The signal bounce inhibiting device according to claim 3 wherein said electric level toggling circuit includes:
    a register for receiving and storing a certain toggling control signal; and
    an XOR gate for receiving said certain toggling control signal and a certain internal signal to perform a first XOR operation, thereby resulting in a toggled or an untoggled output signal.

7. The signal bounce inhibiting device according to claim 6 wherein said electric level recovering circuit includes:
    a register for receiving and storing a certain recovering control signal corresponding to said certain toggling control signal; and
    an XOR gate for receiving said certain recovering control signal and said toggled or untoggled output signal to perform a second XOR operation, thereby recovering said toggled or untoggled output signal into said certain internal signal.

8. The signal bounce inhibiting device according to claim 7 wherein said first toggling control signal is identical to said first recovering control signal, and said second toggling control signal is identical to said second recovering control signal.

9. A signal bounce inhibiting device embedded in a first integrated chip for preventing signals to be transmitted to a second integrated chip from power/ground bounce, comprising:
    an electric level toggling circuit toggling a first internal signal with a first electric level into a first output signal with a second electric level in response to a first toggling control signal and outputting a second internal signal with an electric level remaining unchanged as a second output signal in response to a second toggling control signal; and
    a storing device for storing said first toggling control signal and said second toggling control signal;
    wherein said first output signal with said second electric level is subsequently recovered to said first internal signal with said first electric level in said second integrated chip according to said first toggling control signal.

10. The signal bounce inhibiting device according to claim 9 wherein said electric level toggling circuit includes a plurality of electric level toggling units for receiving a plurality of internal signals and toggling some of said internal signals while untoggling the other internal signals in response to respective toggling control signals simultaneously received.

11. The signal bounce inhibiting device according to claim 9 wherein said electric level toggling circuit includes a plurality of electric level toggling units, each of which includes an XOR gate performing a first XOR operation in response to said first toggling control signal and said first internal signal, thereby toggling said first internal signal, or performing a second XOR operation in response to said second toggling control signal and said second internal signal, thereby untoggling said second internal signal.

12. The signal bounce inhibiting device according to claim 9 wherein said storing device includes a plurality of registers, each of which stores therein said first toggling control signal or said second toggling control signal.

13. A method for preventing from power/ground bounce resulting from signal transmission from a first chip to a second chip, comprising steps of:

asserting a plurality of toggling control signals;

toggling some of a plurality of internal signals and untoggling some of said plurality of internal signals in response to said toggling control signals;

asserting a plurality of recovering control signals correlating to said plurality of toggling control signals; and recovering said plurality of internal signals by changing said toggled internal signals and holding said untoggled internal signals in response to said recovering control signals.

14. The method according to claim 13 wherein said internal signals are toggled in response to first toggling control signals with a first level and recovered in response to first recovering control signals with said first level, and said internal signals are untoggled in response to second toggling control signals with a second level, and remains unchanged in response to second recovering control signals with said second level.

* * * * *